United States Patent
Kawamura

(10) Patent No.: US 8,674,704 B2
(45) Date of Patent: Mar. 18, 2014

(54) METHOD FOR DETECTING INSULATING STATE OF FLOATING POWER SUPPLY, AND DEVICE THEREFOR

(71) Applicant: Yazaki Corporation, Tokyo (JP)

(72) Inventor: Yoshihro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/761,756

(22) Filed: Feb. 7, 2013

(65) Prior Publication Data

US 2013/0147491 A1  Jun. 13, 2013

Related U.S. Application Data

(63) Continuation of application No. PCT/JP2011/068076, filed on Aug. 8, 2011.

(30) Foreign Application Priority Data

Aug. 9, 2010 (JP) ................... 2010-178972
Apr. 25, 2011 (JP) ................... 2011-097520

(51) Int. Cl.
*G01R 31/02* (2006.01)

(52) U.S. Cl.
USPC .......................... 324/541; 324/551

(58) Field of Classification Search
USPC .................... 324/509, 541, 551, 557
See application file for complete search history.

(56) References Cited

U.S. PATENT DOCUMENTS 4,178,617 A * 12/1979 Reichel ........................... 361/43
5,818,236 A    10/1998 Sone et al.

FOREIGN PATENT DOCUMENTS

| JP | 3224977 B2 | 11/2001 |
| JP | 2005-304138 A | 10/2005 |
| JP | 2011-035985 A | 2/2011 |

OTHER PUBLICATIONS

International Search Report of PCT/JP2011/068076 dated Nov. 1, 2011.

* cited by examiner

*Primary Examiner* — Vincent Q Nguyen
(74) *Attorney, Agent, or Firm* — Sughrue Mion, PLLC

(57) ABSTRACT

When, in a state where an AC ground fault occurred on the secondary side of a three-phase inverter circuit, a flying capacitor reaches a continuous charging state while forming a charge circuit including a ground fault resistance due to an AC ground fault, the ground fault resistance due to an AC ground fault is obtained using the same method as that for a positive-side ground fault resistance or a negative-side ground fault resistance due to a DC ground fault. Even if, in the state where the flying capacitor reaches the continuous charging state, a switching duty ratio of respective semiconductor switches of the three-phase inverter circuit varies, a value of a ground fault resistance due to an AC ground fault can be accurately obtained without using the data of the switching duty ratio of respective semiconductor switches of the three-phase inverter circuit.

8 Claims, 11 Drawing Sheets

METHOD FOR DETECTING INSULATING STATE OF FLOATING POWER SUPPLY, AND DEVICE THEREFOR

CROSS REFERENCE TO RELATED APPLICATION

This is a continuation application based on PCT application No. PCT/JP2011/068076 filed on Aug. 8, 2011, which claims the benefit of priority from Japanese Patent Application Nos. 2010-178972 filed on Aug. 9, 2010 and 2011-097520 filed on Apr. 25, 2011, the entire contents of which are incorporated by reference herein.

TECHNICAL FIELD

The present invention relates to a method and a device for detecting a ground fault and an insulating state with respect to a ground potential portion of a floating power supply, and in particular, relates to a method for detecting the insulating state of a floating power supply and a device therefor, for detecting a ground fault and an insulating state with respect to a ground potential portion of, the floating power supply used as the power supply of an AC motor and the wiring thereof.

BACKGROUND ART

For example, in vehicles utilizing electric power as propulsion energy, usually, a high-voltage (e.g., 200 V) DC power supply is insulated from a vehicle body to be used as a floating power supply. Ground faults with respect to a ground potential portion of such a floating power supply include a DC ground fault occurring in a DC circuit portion including a DC power supply and an AC ground fault occurring in an AC circuit portion including an AC motor.

In detecting the ground faults and the insulating state, the value of a ground fault resistance, which is obtained from a charge voltage of a flying capacitor charged by a charge circuit including a DC power supply and the ground fault resistance, is used as a criterion for determining whether the state is good or bad. Then, in the case of an AC ground fault, the flying capacitor is charged only during an ON-duty period of an inverter circuit, and thus even if a time period in which the flying capacitor is connected to a charge circuit is the same, the charge voltage of the flying capacitor differs from the case of a DC ground fault in which the flying capacitor is continuously charged. Then, with regard to the AC ground fault, a proposal to obtain a ground fault resistance in consideration of the ON-duty period has also already been made (e.g., Patent Document 1).

CITATION LIST

Patent Literature

PTL 1: Japanese Patent No. 3224977

SUMMARY OF THE INVENTION

Technical Problem

Incidentally, the ON-duty period of an inverter circuit may vary depending on the situations, such as a change or the like in the output of an AC motor under control of a controller. When the ON-duty period varies, the charge voltage of a flying capacitor, which is charged by a charge circuit during a certain time period, varies even if there is no change in the insulating state. Therefore, if the value of a ground fault resistance is obtained from the charge voltage by using the same obtaining method as that before the ON-duty period varies, the value of a ground fault resistance will vary even if there is no change in the insulating state.

Therefore, it can be considered that a change in the ON-duty period of the inverter circuit is detected by an arithmetic processing on a device side that determines a ground fault, and depending on this result, the method for obtaining a ground fault resistance is changed. However, unless the processing capability of the device catches up with the speed of a change in the ON-duty period, it is likely that the device cannot change the method for obtaining a ground fault resistance while following a change in the ON-duty period in real time.

The present invention has been made in view of the above-described circumstances, and an object of the present invention is to provide a method for detecting an insulating state of a floating power supply, the method enabling the detection of the insulating state of an AC circuit portion based on an accurate value of a ground fault resistance even if the ON-duty period of an inverter circuit may vary, and a device for detecting an insulating state of a floating power supply, the device being suitably used in executing this method.

Solution to Problem

In order to achieve the above-described purposes, according to a first aspect of the present invention, there is provided a method for detecting an insulating state of a floating power supply, which DC-AC converts an electric power of a DC power supply insulated from a ground potential portion using a three-phase inverter circuit provided on a main circuit wiring on a positive terminal side and a negative terminal side of the DC power supply to supply the resulting power to a three-phase motor, by using a value of a ground fault resistance of the main circuit wiring obtained based on a charge voltage of a condenser that has been connected between the main circuit wiring and a ground potential portion for a scheduled time period, the method comprising the steps of: based on a charge voltage of the condenser, which initially has a discharged state, having been connected between one side of the main circuit wiring and the ground potential portion for the scheduled time period and based on a charge voltage of the condenser, which initially has a discharged state, having been connected between other side of the main circuit wiring and the ground potential portion for the scheduled time period, determining whether an insulating state in a DC circuit portion of the floating power supply including the primary side of the three-phase inverter circuit is detected or an insulating state in an AC circuit portion of the floating power supply including the secondary side of the three-phase inverter circuit is detected; when it is determined that the insulating state in the AC circuit portion is detected, determining whether or not the condenser has been continuously charged during the scheduled time period; and when it is determined that the condenser has been continuously charged during the scheduled time period, obtaining a value of the ground fault resistance using the same method as that of the case where it is determined that the charged state in the DC circuit portion is detected.

Furthermore, in order to achieve the above-described purposes, according to a second aspect of the present invention, there is a device for detecting an insulating state of a floating power supply which DC-AC converts an electric power of a DC power supply insulated from a ground potential portion using a three-phase inverter circuit provided on a main circuit wiring on a positive terminal side and a negative terminal side of the DC power supply to supply the resulting power to a three-phase motor, by using a value of a ground fault resistance of the main circuit wiring obtained based on a charge voltage of a condenser that has been connected between the main circuit wiring and a ground potential portion, for a scheduled time period. The device includes: a first switching unit configured to connect the condenser, which has been discharged, between one side of the main circuit wiring and the ground potential portion for a scheduled time period to charge the condenser; a second switching unit configured to connect the condenser, which has been discharged, between other side of the main circuit wiring and the ground potential portion, for the scheduled time period to charge the condenser; a measurement unit configured to measure a charge voltage of the condenser; a third switching unit configured to connect the condenser charged using the first switching unit to the measurement unit for a measurement of a charge voltage of the condenser by the measurement unit; a fourth switching unit configured to connect the condenser charged using the second switching unit to the measurement unit for a measurement of a charge voltage of the condenser by the measurement unit; a first determination unit configured to determine, based on the charge voltage of the condenser measured by the measurement unit with the third switching unit and based on the charge voltage of the condenser measured by the measurement unit with the fourth switching unit, whether an insulating state in a DC circuit portion of the floating power supply including the primary side of the three-phase inverter circuit is detected or an insulating state in an AC circuit portion of the floating power supply including the secondary side of the three-phase inverter circuit is detected; a second determination unit configured to determine, when the first determination unit determines that the insulating state in the AC circuit portion is detected, whether or not the condenser has been continuously charged during the scheduled time period; and a ground fault resistance calculation unit configured to obtain, when the second determination unit determines that the condenser has been continuously charged during the scheduled time period, a value of the ground fault resistance by using the same method as that of the case where the first determination unit determines that the charged state in the DC circuit portion is detected.

According to the method for detecting an insulating state of a floating power supply and the device for detecting an insulating state of a floating power supply, when it is determined, based on a charge voltage of the condenser that has been connected between one side of the main circuit wiring and the ground potential portion for a scheduled time period and based on a charge voltage of the condenser that has been connected between other side of the main circuit wiring and the ground potential portion for a scheduled time period, that an insulating state in an AC circuit portion of the floating power supply including the secondary side of the three-phase inverter circuit is detected, and if the condenser has been continuously charged during the scheduled time period, the value of the ground fault resistance is obtained using the same method as that of the case where it is determined that the charged state in the DC circuit portion of the floating power supply including the primary side of the three-phase inverter circuit is detected.

Accordingly, even when the insulating state in the AC circuit portion of the floating power supply is detected and if the condenser has been continuously charged during the scheduled time period, the value of the ground fault resistance due to an AC ground fault can be accurately obtained without recognizing the ON-duty period of the three-phase inverter circuit or without performing a processing which follows a change in the recognized ON-duty period. Accordingly, the detection of the insulating state of an AC circuit portion of the floating power supply, based on an accurate value of the ground fault resistance due to an AC ground fault, can be enabled.

Moreover, the method for detecting an insulating state of a floating power supply further includes the step of: when it is determined that the condenser has not been continuously charged during the scheduled time period, obtaining a value of the ground fault resistance by using a method for a correction in accordance with a switching duty ratio at the time of the DC-AC conversion of the three-phase inverter circuit.

Furthermore, the device for detecting an insulating state of a floating power supply further includes a corrected-ground fault resistance calculation unit configured to obtain, when the second determination unit determines that the condenser has not been continuously charged during the scheduled time period, the value of the ground fault resistance by a method for a correction in accordance with a switching duty ratio at the time of the DC-AC conversion of the three-phase inverter circuit.

According to the method for detecting an insulating state of a floating power supply and the device for detecting an insulating state of a floating power supply, in each case, by the stage prior to making the correction corresponding to the switching duty ratio at the time of the DC-AC conversion of the three-phase inverter circuit, the necessity of performing the processing which follows a change in the ON-duty period is eliminated, thereby allowing the reduction in the burden of the processing.

Moreover, the method for detecting an insulating state of a floating power supply further includes the step of: when it is determined that the condenser has not been continuously charged during the scheduled time period, obtaining a value of the ground fault resistance by a method for a correction in accordance with a switching frequency at the time of the DC-AC conversion of the three-phase inverter circuit.

Furthermore, the device for detecting an insulating state of a floating power supply further includes a corrected-ground fault resistance calculation unit configured to obtain, when the second determination unit determines that the condenser has not been continuously charged during the scheduled time period, the value of the ground fault resistance by a method for a correction in accordance with a switching frequency at the time of the DC-AC conversion of the three-phase inverter circuit.

According to the method for detecting an insulating state of a floating power supply and the device for detecting an insulating state of a floating power supply, in each case, by the stage prior to making the correction corresponding to the switching frequency at the time of the DC-AC conversion of the three-phase inverter circuit, the necessity of performing the processing which follows the change in the ON-duty period is eliminated, thereby allowing the reduction in the burden of the processing.

Moreover, the method for detecting an insulating state of a floating power supply further includes the step of: when it is determined that the condenser has not been continuously charged during the scheduled time period, obtaining a value of the ground fault resistance by a method for a correction in accordance with a capacitance of positive and negative Y condensers connected between the ground potential portion and a positive terminal and a negative terminal of the DC power supply, respectively.

Furthermore, the device for detecting an insulating state of a floating power supply further includes a corrected-ground fault resistance calculation unit configured to obtain, when the second determination unit determines that the condenser has not been continuously charged during the scheduled time period, a value of the ground fault resistance by a method for a correction in accordance with a capacitance of positive and negative Y condensers connected between the ground potential portion and a positive terminal and a negative terminal of the DC power supply, respectively.

According to the method for detecting an insulating state of a floating power supply and the device for detecting an insulating state of a floating power supply, in each case, by the stage prior to making correction corresponding to a capacitance of the positive and negative Y condensers connected between the ground potential portion and the positive terminal and the negative terminal of the DC power supply, respectively, the necessity of performing the processing which follows the change in the ON-duty period is eliminated, thereby allowing the reduction in the burden of the processing.

Advantageous Effects of Invention

According to the method for detecting an insulating state of a floating power supply and the device for detecting an insulating state of a floating power supply of the present invention, even if the ON-duty period of an inverter circuit may vary, the detection of the insulating state of an AC circuit portion based on an accurate value of a ground fault resistance can be enabled.

BRIEF DESCRIPTION OF DRAWINGS

FIG. 2 is charged with a charge voltage corresponding to a positive-side or negative-side ground fault resistance on the primary side and a case where it is charged with a charge voltage corresponding to a ground fault resistance on the secondary side.

DESCRIPTION OF EMBODIMENTS

Hereinafter, embodiments of the present invention will be described with reference to the accompanying drawings.

Figure 1:
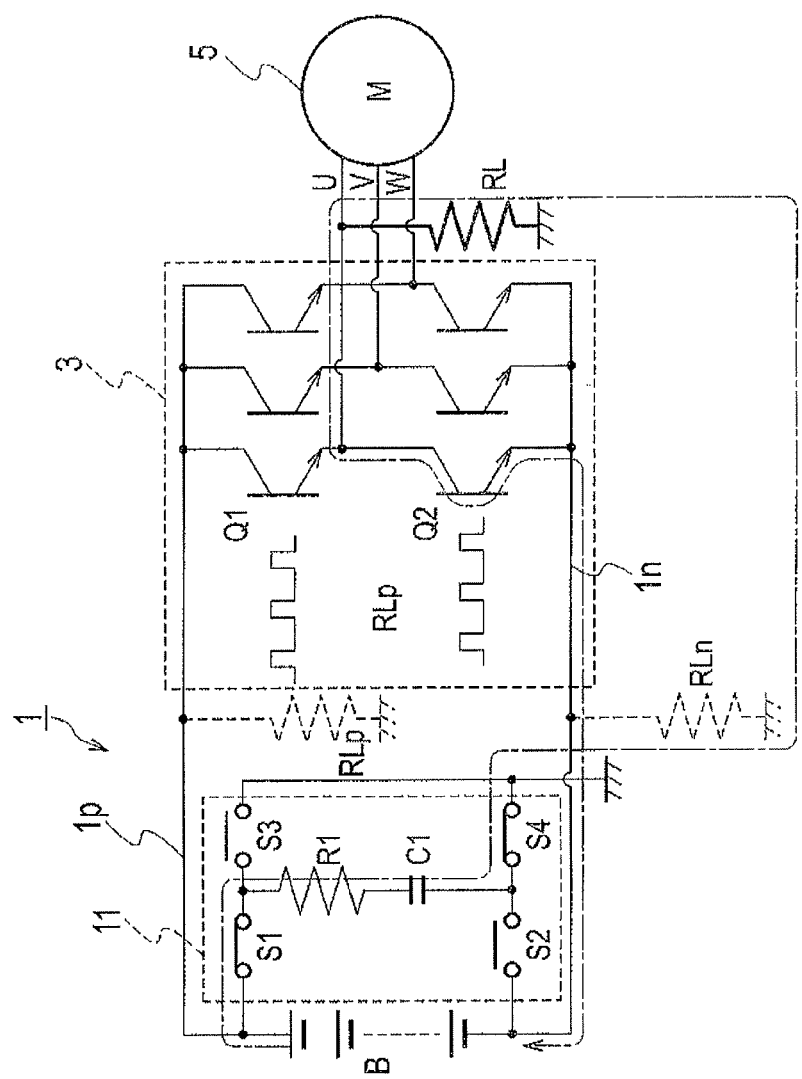
FIG. 1 is the circuit diagram of a step-up power supply circuit for detecting a ground fault through the use of a ground detection unit according to an embodiment of the present invention, to which a method for detecting an insulating state of a floating power supply according to the present invention is applied.

FIG. 1 is the circuit diagram of a step-up power supply circuit for detecting a ground fault with a ground detection unit according to one embodiment of the present invention, to which a method for detecting an insulating state of a floating power supply according to the present invention is applied. The step-up power supply circuit indicated by reference sign 1 in FIG. 1 includes a DC power supply B insulated from a ground potential portion of a vehicle body or the like of a vehicle (not shown) or the like, a three-phase inverter circuit 3, to the primary side of which a positive terminal-side main circuit wiring 1*p* and a negative terminal-side main circuit wiring 1*n* of the DC power supply B are connected, and a three-phase motor 5 for vehicle propulsion or the like connected to the secondary side of the three-phase inverter circuit 3.

In the step-up power supply circuit 1, semiconductor switches (e.g., an IGBT, a power MOSFET, or the like) of an upper arm Q1 and a lower arm Q2 of the three-phase inverter circuit 3, corresponding to respective phases, are repeatedly turned on and off at a switching duty ratio specified through the control of a non-illustrated vehicle propulsion controller, and thus a DC power of the DC power supply B is boosted to an AC power by DC-AC conversion. Then, this AC power is supplied to each phase of U, V, and W of the three-phase motor 5.

Note that, in FIG. 1, the reference sign RLp indicates a positive-side ground fault resistance on the primary side and the reference sign RLn indicates a negative-side ground fault resistance on the primary side, and each of these resistances is a virtual resistance, when a ground fault (DC ground fault) occurs in a primary-side main circuit wiring portion (corresponding to a DC circuit portion of a floating power supply in the claims) among the positive terminal-side main circuit wiring 1*p* and the negative terminal-side main circuit wiring 1*n*. Moreover, the reference sign RL indicates a ground fault resistance on the secondary side in FIG. 1 and is a virtual resistance when a ground fault (AC ground fault) occurs in a secondary-side mail circuit wiring portion (corresponding to an AC circuit portion of the floating power supply in the claims) of the positive terminal-side main circuit wiring 1*p* and the negative terminal-side main circuit wiring 1*n*.

Figure 2:
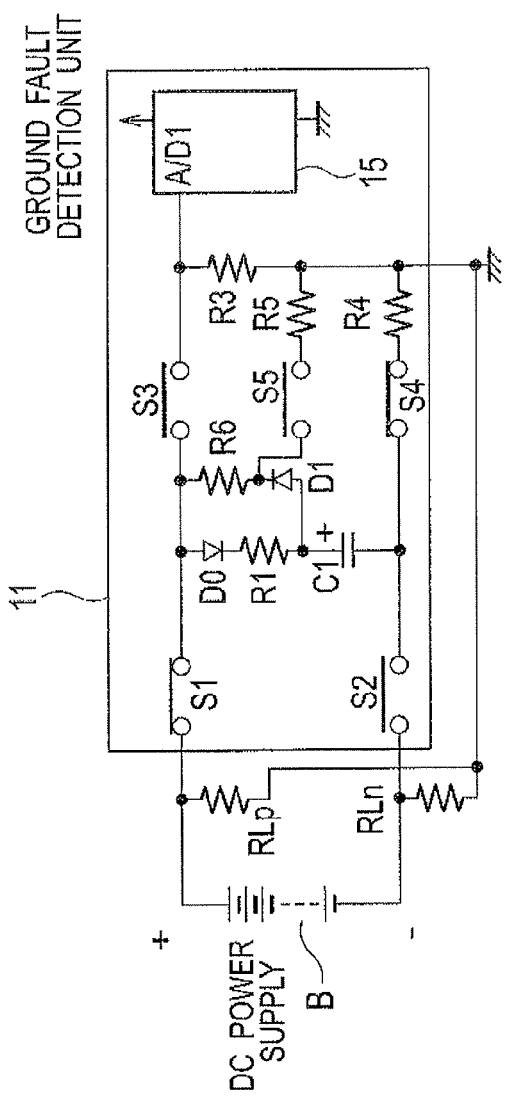
FIG. 2 is a circuit diagram showing the ground detection unit, a part of the configuration of which is shown in FIG. 1.

Note that, FIG. 1 shows a part of a ground fault detection unit 11 (corresponding to a device for detecting an insulating state of a floating power supply in the claims) which detects a ground fault and an insulating state of the step-up power supply circuit 1. The ground fault detection unit 11 has, as shown in a circuit diagram of FIG. 2, a flying capacitor C1 (corresponding to a condenser in the claims), switches S1 and S2 which selectively connect the flying capacitor C1 to a positive electrode and a negative electrode of the DC power supply B, respectively, and switches S3 and S4 which selectively connect the flying capacitor C1 to a microcomputer (hereinafter, referred to as a "microcomputer" in short) 15 and a ground potential portion.

Furthermore, the ground fault detection unit 11 has a switch S5 which selectively connects (selectively grounds) one end of the flying capacitor C1 (the upper pole in FIG. 1 and FIG. 2) to the ground potential portion for the purpose of discharging.

The microcomputer 15 operates by a low-voltage power supply (not shown) lower than the DC power supply B, and the DC power supply B is insulated also from a ground potential of the microcomputer 15. Each of the switches S1 to S5 is constituted by an optical MOSFET, for example, and is insulated from the DC power supply B and can be on/off-controlled by the microcomputer 15.

The connection point between the microcomputer 15 and the switch S3 is grounded via a resistor R3, and resistors R4 and R5 are connected between the switches S4 and S5 and the ground potential portion, respectively. The switches S1 and S3 on one end side (the upper pole in FIG. 1 and FIG. 2) of the flying capacitor C1 are connected in series, and a current-direction switching circuit is connected between the connection point of both the switches S1 and S3 and one end of the flying capacitor C1.

The current-direction switching circuit is a parallel circuit, one of which includes a series circuit of a diode D0 and a resistor R1 in a forward direction from the switches S1 and S3 toward one end of the flying capacitor C1 and the other one of which includes a series circuit of a diode D1 and a resistor R6 in a forward direction from the one end of the flying capacitor C1 toward the switches S1 and S3.

Then, the above-described switch S5 is not directly connected to the one end of the flying capacitor C1 (the upper pole in FIG. 1 and FIG. 2), but is connected via the diode D1 (connected to the cathode of the diode D1).

Note that, as required, the switches S1 and S2 may be connected to the both ends of a certain resistor among the series resistors connected in parallel between the positive electrode and the negative electrode of the DC power supply B, and thus a voltage obtained by dividing the voltage of the DC power supply B may be charged in the flying capacitor C1.

Then, in the present embodiment, first to fourth switching units in the claims include the microcomputer 15 and the switches S1 to S5.

In the above-described ground fault detection unit 11, in detecting a ground fault and an insulating state, first, the switches S1 and S2 are turned on and also the switches S3 to S5 are turned off over a predetermined scheduled time period through the control of the microcomputer 15. Here, the scheduled time period is a time period shorter than a time taken for the flying capacitor C1 to be fully charged.

Therefore, a charge circuit is formed from the positive electrode of the DC power supply B through the positive terminal-side main circuit wiring 1p, the switch S1, the diode D0, the resistor R1, one end (the upper pole in FIG. 1 and FIG. 2) and the other end (the lower pole in FIG. 1 and FIG. 2) of the flying capacitor C1, the switch S2, and the negative terminal-side main circuit wiring 1n to the negative electrode of the DC power supply B. Then, in this charge circuit, the flying capacitor C1 is charged with the charge amount corresponding to the voltage of the DC power supply B. With this charging, one end of the flying capacitor C1 serves as a positive electrode and the other end serves as a negative electrode.

Subsequently, through the control of the microcomputer 15, the switches S1, S2, and S5 are turned off and also the switches S3 and S4 are turned on. Therefore, the flying capacitor C1 is connected in parallel to a series circuit of the resistor R6, the resistor R3, and the resistor R4. Then, a potential corresponding to a voltage difference between both ends of the resistor R3 among the voltages obtained by dividing the charge voltage of the flying capacitor C1 with the resistors R6, R3, and R4 is input to a first A/D conversion port A/D1 of the microcomputer 15 and is measured there. From this measurement value and a division ratio of the resistors R6, R3, and R4, the charge voltage of the flying capacitor C1 is measured by the microcomputer 15.

Then, through the control of the microcomputer 15, over a time sufficient to fully discharge the flying capacitor C1, the switch S5 is turned on and also the other switches S1 to S4 are turned off, to ground one end (positive electrode) of the flying capacitor C1 via the diode D1, the switch S5 and the resistor R5, thereby forming a discharge circuit. Then, with this discharge circuit, the flying capacitor C1 is discharged.

Next, through the control of the microcomputer 15, over the above-described scheduled time period, the switches S1 and S4 are turned on and also the switches S2, S3, and S5 are turned off. Thus, with regard to a DC ground fault, a charge circuit is formed, from the positive electrode of the DC power supply B, through the positive terminal-side main circuit wiring 1p, the switch S1, the diode D0, the resistor R1, one end and the other end of the flying capacitor C1, the switch S4, the resistor R4, (the ground potential portion,) the negative-side ground fault resistance RLn on the primary side, and the negative terminal-side main circuit wiring 1n, to the negative electrode of the DC power supply B.

Moreover, with regard to an AC ground fault, as shown in FIG. 1, a charge circuit is formed, from the positive electrode of the DC power supply B, through the positive terminal-side main circuit wiring 1p, the switch S1, (the non-illustrated diode D0 in FIG. 1,) the resistor R1, one end and the other end of the flying capacitor C1, the switch S4, (the non-illustrated resistor R4 and ground potential portion in FIG. 1) the ground fault resistance RL on the secondary side (FIG. 1 illustrates a case where a ground fault occurs in a U phase), the semiconductor switch in an ON state of the lower arm Q2 of the three-phase inverter circuit 3, and the negative terminal-side main circuit wiring 1n, to the negative electrode of the DC power supply B.

Then, in these charge circuits, the flying capacitor C1 is charged with a charge amount corresponding to the negative-side ground fault resistance RLn on the primary side or the ground fault resistance RL on the secondary-side. With this charging, one end of the flying capacitor C1 serves as the positive electrode and the other end serves as the negative electrode.

In this manner, the state where the microcomputer 15 turns on the switches S1 and S4 and also turns off the switches S2, S3, and S5 corresponds to a state where a condenser in the claims is charged over a scheduled time period by a first switching unit in the claims.

Subsequently, through the control of the microcomputer 15 shown in FIG. 1, the switches S1, S2, and S5 are turned off and also the switches S3 and S4 are turned on to form the same measurement circuit as that in measuring the charge voltage of the flying capacitor C1 corresponding to the voltage of the DC power supply B. Then, through the use of this measurement circuit, the charge voltage of the flying capacitor C1 is measured by the microcomputer 15.

Accordingly, in the present embodiment, the microcomputer 15 corresponds to a measurement unit in the claims. Moreover, the state where the microcomputer 15 turns off the switches S1, S2, and S5 and also turns on the switches S3 and S4 and measures the charge voltage of the flying capacitor C1, corresponds to a state where the measurement unit measures the charge voltage of the condenser in the claims using a third switching unit in the claims.

Then, through the control of the microcomputer 15, over a time sufficient to fully discharge the flying capacitor C1, the switch S5 is turned on and also the other switches S1 to S4 are turned off to ground one end (positive electrode) of the flying capacitor C1 via the diode D1, the switch S5, and the resistor R5, thereby forming a discharge circuit. Then, with this discharge circuit, the flying capacitor C1 is discharged.

Next, through the control of the microcomputer 15, over the above-described scheduled time period, the switches S2 and S3 are turned on and also the switches S1, S4, and S5 are turned off. Thus, with regard to a DC ground fault, a charge circuit is formed from the positive electrode of the DC power supply B through the positive terminal-side main circuit wiring 1p, the positive-side ground fault resistance RLp, (the ground potential portion) the resistor R3, the switch S3, the diode D0, the resistor R1, one end and the other end of the flying capacitor C1, the switch S2, and the negative terminal-side main circuit wiring 1n to the negative electrode of the DC power supply B.

Moreover, with regard to an AC ground fault, a charge circuit is formed from the positive electrode of the DC power supply B shown in FIG. 1 through the positive terminal-side main circuit wiring 1p, the semiconductor switch in an ON state of the upper arm Q1 of the three-phase inverter circuit 3, the ground fault resistance RL on the secondary side (FIG. 1 illustrates a case where a ground fault occurs in a U phase), (the ground potential portion, the non-illustrated resistor R3 in FIG. 1) the switch S3, (the non-illustrated diode D0 in FIG. 1,) the resistor R1, one end and the other end of the flying capacitor C1, the switch S2, and the negative terminal-side main circuit wiring 1n to the negative electrode of the DC power supply B.

Then, in these charge circuits, the flying capacitor C1 is charged with the charge amount corresponding to the positive-side ground fault resistance RLp on the primary side or the ground fault resistance RL on the secondary side. With this charging, one end of the flying capacitor C1 serves as the positive electrode and the other end serves as the negative electrode.

In this manner, the state where the microcomputer 15 turns on the switches S2 and S3 and also turns off the switches S1, S4, and S5 corresponds to a state where a condenser in the claims is charged over a scheduled time period by a second switching unit in the claims.

Subsequently, through the control of the microcomputer 15, the switches S1, S2, and S5 are turned off and also the switches S3 and S4 are turned on to form the same measurement circuit as that in measuring the charge voltage of the flying capacitor C1 corresponding to the voltage of the DC power supply B, or that in measuring the charge voltage of the flying capacitor C1 corresponding to the negative-side ground fault resistance RLn on the primary side or the ground fault resistance RL on the secondary side. Then, using this measurement circuit, the charge voltage of the flying capacitor C1 is measured by the microcomputer 15.

In this manner, the state where the microcomputer 15 turns off the switches S1, S2, and S5 and also turns on the switches S3 and S4 and measures the charge voltage of the flying capacitor C1 corresponds to a state where the measurement unit measures the charge voltage of the condenser in the claims using a fourth switching unit in the claims.

Then, through the control of the microcomputer 15 shown in FIG. 1, over a time sufficient to fully discharge the flying capacitor C1, the switch S5 is turned on and also the other switches S1 to S4 are turned off to ground one end (positive electrode) of the flying capacitor C1 via the diode D1, the switch S5, and the resistor R5, thereby forming a discharge circuit. Then, with this discharge circuit, the flying capacitor C1 is discharged.

By using the charge voltage of the flying capacitor C1 corresponding to the voltage of the DC power supply B, the charge voltage of the flying capacitor C1 corresponding to the negative-side ground fault resistance RLn on the primary side or the ground fault resistance RL on the secondary side, and the charge voltage of the flying capacitor C1 corresponding to the positive-side ground fault resistance RLp on the primary side or the ground fault resistance RL on the secondary side, measured as described above, a calculation through the use of a predetermined measurement theoretical equation is performed, and thus the microcomputer 15 can obtain the value of the positive-side ground fault resistance RLp on the primary side and the negative-side ground fault resistance RLn on the primary side, or the ground fault resistance RL on the secondary side, and can detect a ground fault and an insulating state of the DC power supply B based on the above obtaining results. The method for obtaining the value of each ground fault resistance RLp, RLn, and RL using the microcomputer 15 will be described later.

Note that, the microcomputer 15 of the present embodiment periodically receives, from the above-described non-illustrated vehicle propulsion controller, data indicative of the switching duty ratio of respective semiconductor switches of the three-phase inverter circuit 3 of the step-up power supply circuit 1 as information used to obtain the ground fault resistance RL due to an AC ground fault.

Incidentally, the images of increases of the charged electric charge of the flying capacitor C1 are different from each other between a case where the flying capacitor C1 is charged with a charge voltage corresponding to the positive-side ground fault resistance RLp on the primary side or the negative-side ground fault resistance RLn on the primary side and a case where the flying capacitor C1 is charged with a charge voltage corresponding to the ground fault resistance RL on the secondary side. This is shown in a graph of FIG. 3.

Figure 3:
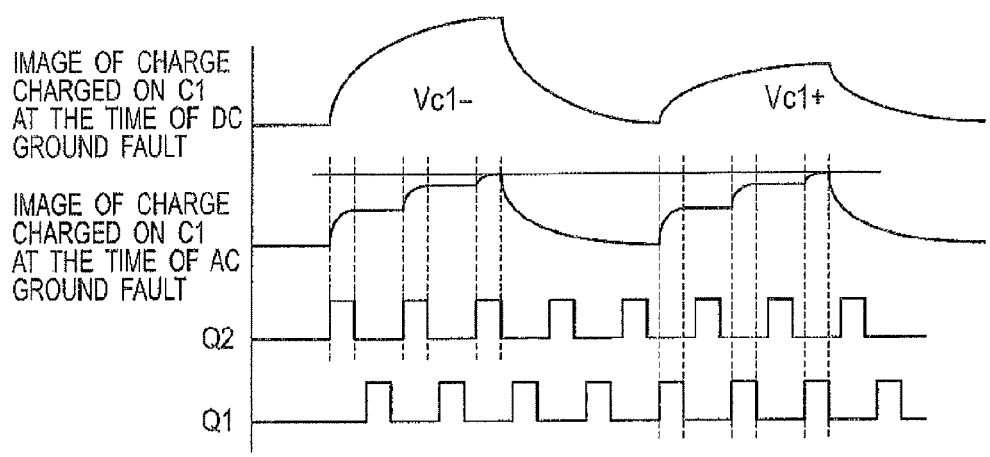
FIG. 3 is a graph showing images of increases in the charged electric charge for comparison between a case where a flying capacitor of FIG. 1

As shown in FIG. 3, in the case where the flying capacitor C1 is charged with a charge voltage corresponding to the positive-side ground fault resistance RLp on the primary side or the negative-side ground fault resistance RLn on the primary side, the flying capacitor C1 is continuously charged over the entire scheduled time period. Therefore, the image of an increase in the charged electric charge of the flying capacitor C1 becomes a continuously increasing image as shown in the top row of FIG. 3.

In contrast, in the case where the flying capacitor C1 is charged with a charge voltage corresponding to the secondary-side ground fault resistance RL, the flying capacitor C1 is intermittently charged during an ON-duty period of the upper arm Q1 or the lower arm Q2 of the three-phase inverter circuit. Accordingly, the image of an increase in the charged electric charge of the flying capacitor C1 becomes a step-wisely increasing image as shown in the second row of FIG. 3 in synchronization with the ON-duty period of the lower arm Q2 or the upper arm Q1 of the three-phase inverter circuit shown in the third row and in the bottom row of FIG. 3, respectively.

As a result, although a time length in which the charge circuit is formed is equal to the scheduled time period for the both cases, the charge amount charged in the flying capacitor C1 is smaller in the case where the flying capacitor C1 is charged with a charge voltage corresponding to the secondary-side ground fault resistance RL.

Therefore, when an AC ground fault occurs in which the flying capacitor C1 is intermittently charged, the microcomputer 15 cannot obtain the value of the ground fault resistance with a predetermined measurement theoretical equation used in a DC ground fault.

Figure 4:
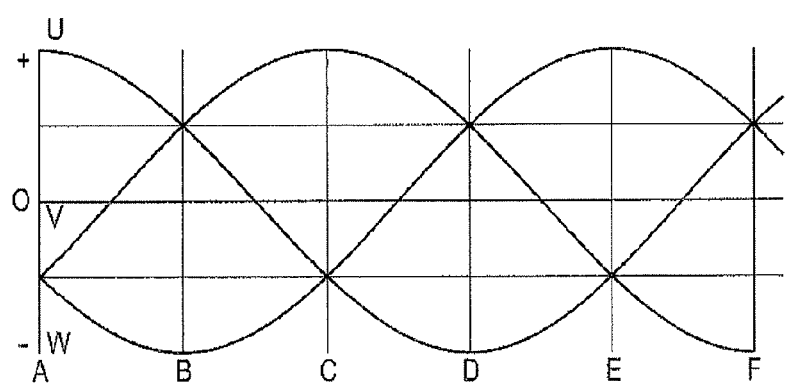
FIG. 4 is a waveform chart showing AC currents supplied to respective phases from a three-phase inverter circuit when a three-phase motor of FIG. 1 is driven by an AC current with a duty ratio of 50%.
Figure 5:
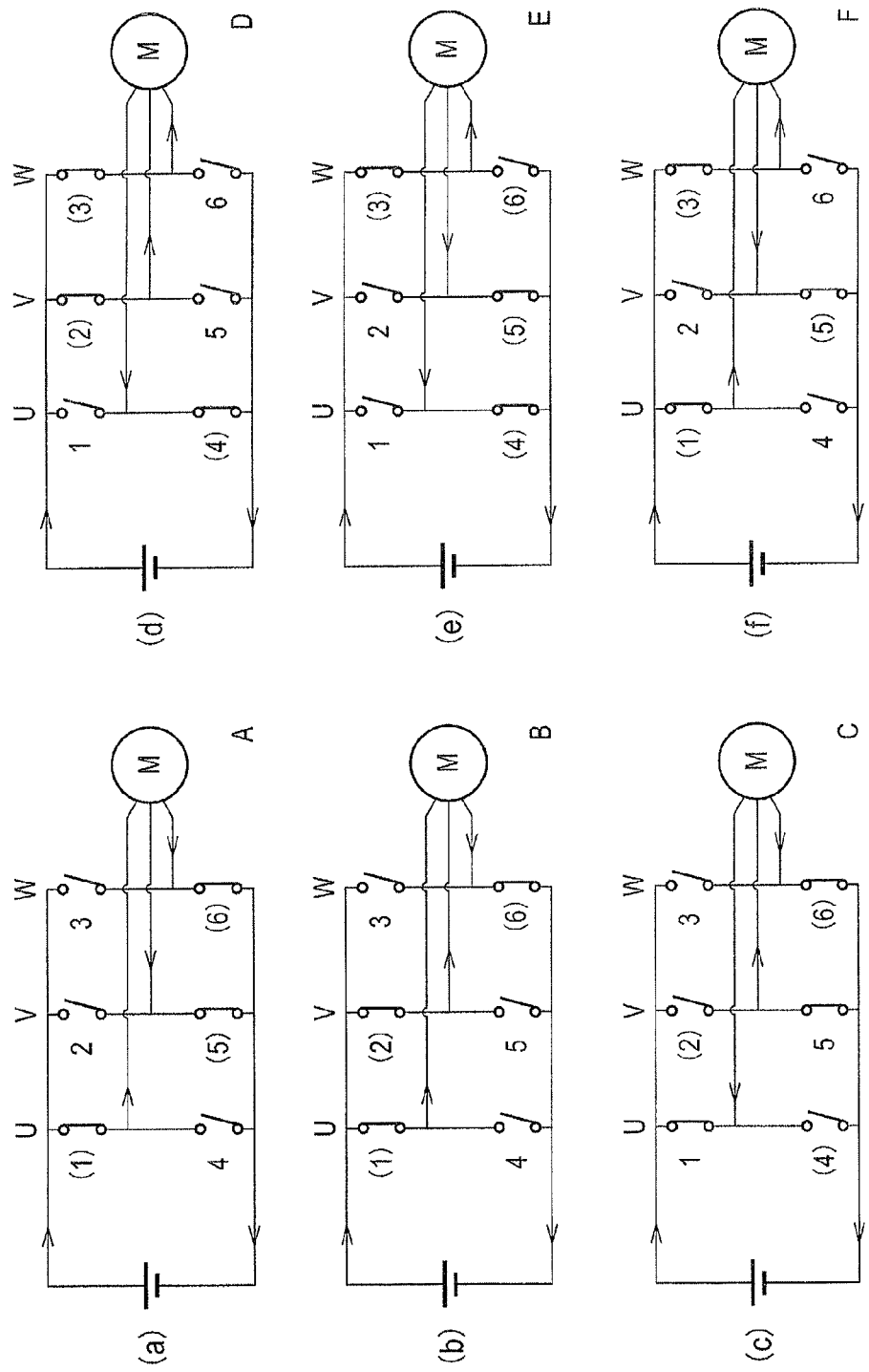
FIGS. 5(*a*) to 5(*f*) are circuit diagrams showing changes in the switching state of the three-phase inverter circuit of FIG. 1.

Incidentally, when the duty ratio of the three-phase AC current, which the three-phase inverter circuit 3 supplies to the three-phase motor 5, is set to a duty ratio of 50% shown in the waveform chart of FIG. 4, for example, the on/off states of each semiconductor switch of the upper arm Q1 and the lower arm Q2 of the three-phase inverter circuit 3 at each of the time points of A to F in the view are as shown in each circuit diagram of FIGS. 5(a) to 5(f). Note that a switch with a parenthesized number indicates the switch in an OFF state. Then, changes in the on/off states of each of the switches 4 to 6 of the lower arm Q2 are shown in a chart of FIG. 6.

Figure 6:
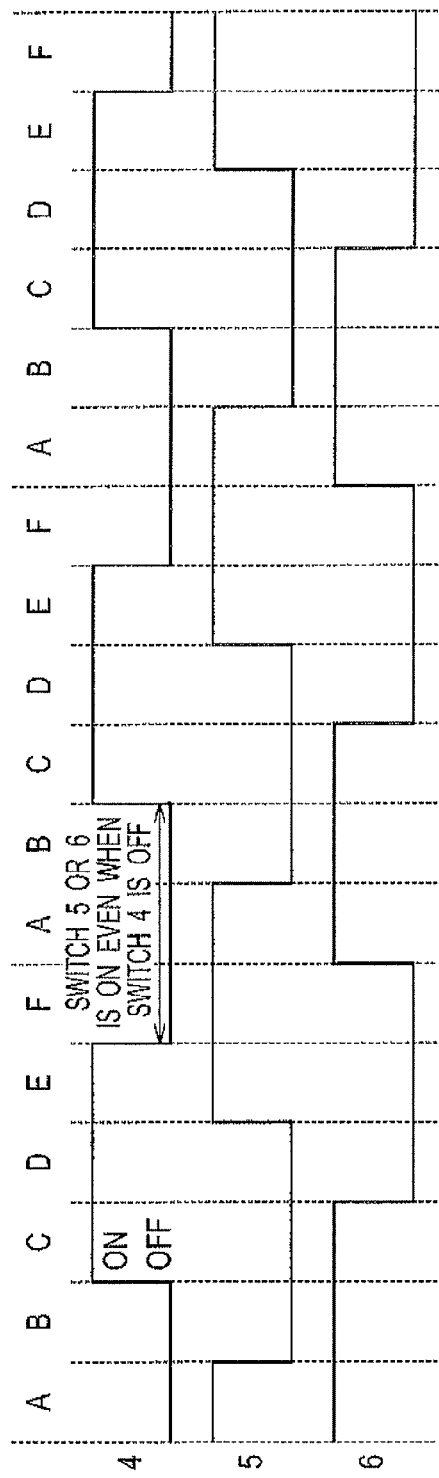
FIG. 6 is a chart showing the on/off states of respective semiconductor switches of the lower arm of the three-phase inverter circuit at each time point in FIGS. 5(*a*) to 5(*f*).

For example, with regard to the switch 4 corresponding to the U phase of the three-phase motor 5 shown in the upper row of FIG. 6, during a period of F to A to B during which the switch 4 is OFF, the switch 5 or 6 is always ON.

In this manner, when the switching duty ratio of the upper arm Q1 or the lower arm Q2 of the three-phase inverter circuit 3 exceeds 100/3(%), a time period occurs during which other switch is ON while a certain switch is OFF.

Figure 7:
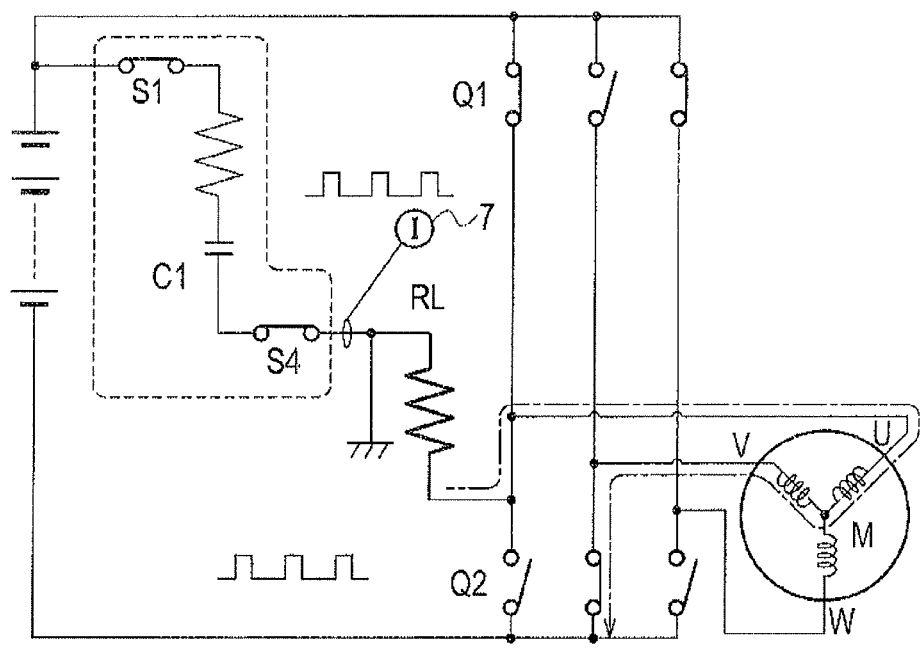
FIG. 7 is a circuit diagram showing an alternative path of a charge circuit of a flying capacitor, the charge circuit including a ground fault resistance due to an AC ground fault formed in the step-up power supply circuit of FIG. 1.

For example, as shown in FIG. 1, when an AC ground fault occurs in the U phase of the three-phase motor 5, the charge circuit of the flying capacitor C1 including the ground fault resistance RL corresponding to an AC ground fault should have essentially been formed only during a time period during which the switch 4 corresponding to the U phase is ON. However, when the switching duty ratio of the upper arm Q1 or the lower arm Q2 of the three-phase inverter circuit 3 exceeds 100/3(%), a charge circuit of the flying capacitor C1, for example, as shown in a circuit diagram of FIG. 7 is formed, while bypassing other switch (in the case of FIG. 7, the switch 5 corresponding to the V phase) in an ON state.

Accordingly, when an AC ground fault occurs in the step-up power supply circuit 1, and if the switching duty ratio of the three-phase inverter circuit 3 exceeds 100/3(%), the flying capacitor C1 does not reach the above-described intermittent charging state. Then, through the on/off control of the switches S1 to S5 by the microcomputer 15 of FIG. 1, the flying capacitor C1 is continuously charged over the entire scheduled time period during which the charge circuit of the flying capacitor C1 including the ground fault resistance RL is formed.

Figure 8:
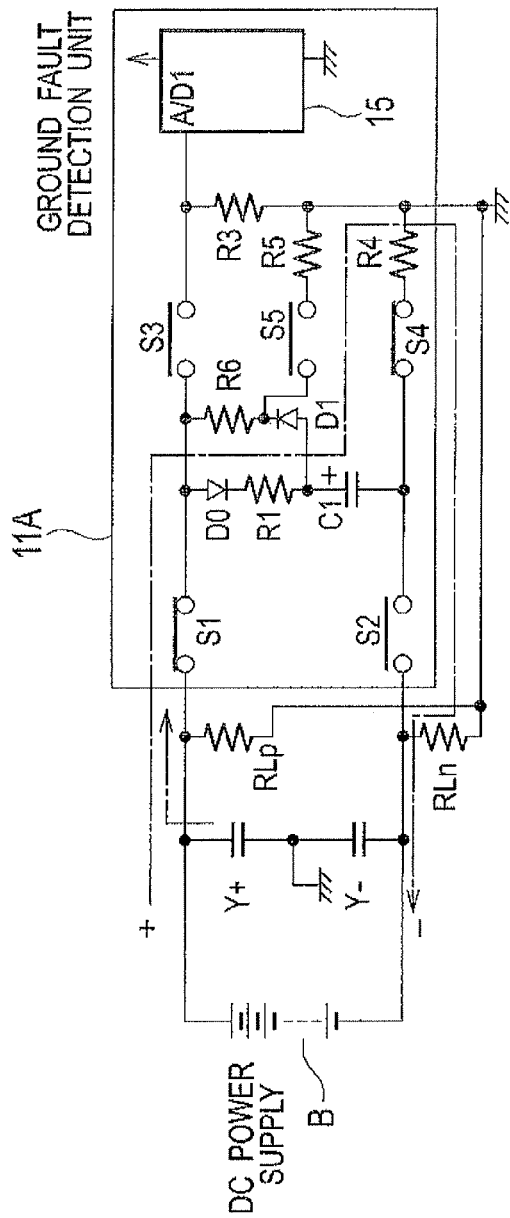
FIG. 8 is a circuit diagram showing the case where a Y condenser is added to the step-up power supply circuit of FIG. 1.

Note that the case where the flying capacitor C1 is continuously charged over the entire scheduled time period, in which the charge circuit of the flying capacitor C1 including the ground fault resistance RL is formed, at the time of the occurrence of an AC ground fault is assumed in other situation. As shown in FIG. 8, a case where common mode noise-suppression Y condensers Y+ and Y− are interposed between each of the positive and negative electrodes of the DC power supply B and the ground potential portion, in the step-up power supply circuit 1 of FIG. 1 is one example.

The above-described Y condensers Y+ and Y− discharge the charged electric charge at the time of charging of the flying capacitor C1. Therefore, when a charge circuit of the flying capacitor C1 including the ground fault resistance RL is intermittently formed at the time of the occurrence of an AC ground fault, even in a period in which the charge circuit is not formed, a charge circuit that charges the discharged electric charge of the Y condensers Y+ and Y− to the flying capacitor C1 is formed on the primary side of the three-phase inverter circuit 3. Consequently, the flying capacitor C1 may reach a continuous charging state during the scheduled time period.

Thus, in the ground fault detection unit 11 of the present embodiment, the microcomputer 15, at the time of the occurrence of an AC ground fault, selects a method for obtaining the secondary-side ground fault resistance RL, depending on whether or not the flying capacitor C1 is in a continuous charging state during the scheduled time period during which a charge circuit that charges the flying capacitor C1 with a charge voltage corresponding to the secondary-side ground fault resistance RL is formed.

Next, a processing for obtaining the ground fault resistances RLp, RLn, and RL due to a DC ground fault and an AC ground fault, which the microcomputer 15 of the ground fault detection unit 11 performs in accordance with a program stored in an incorporated ROM, will be described with reference to a flow chart of FIG. 9.

Figure 9:
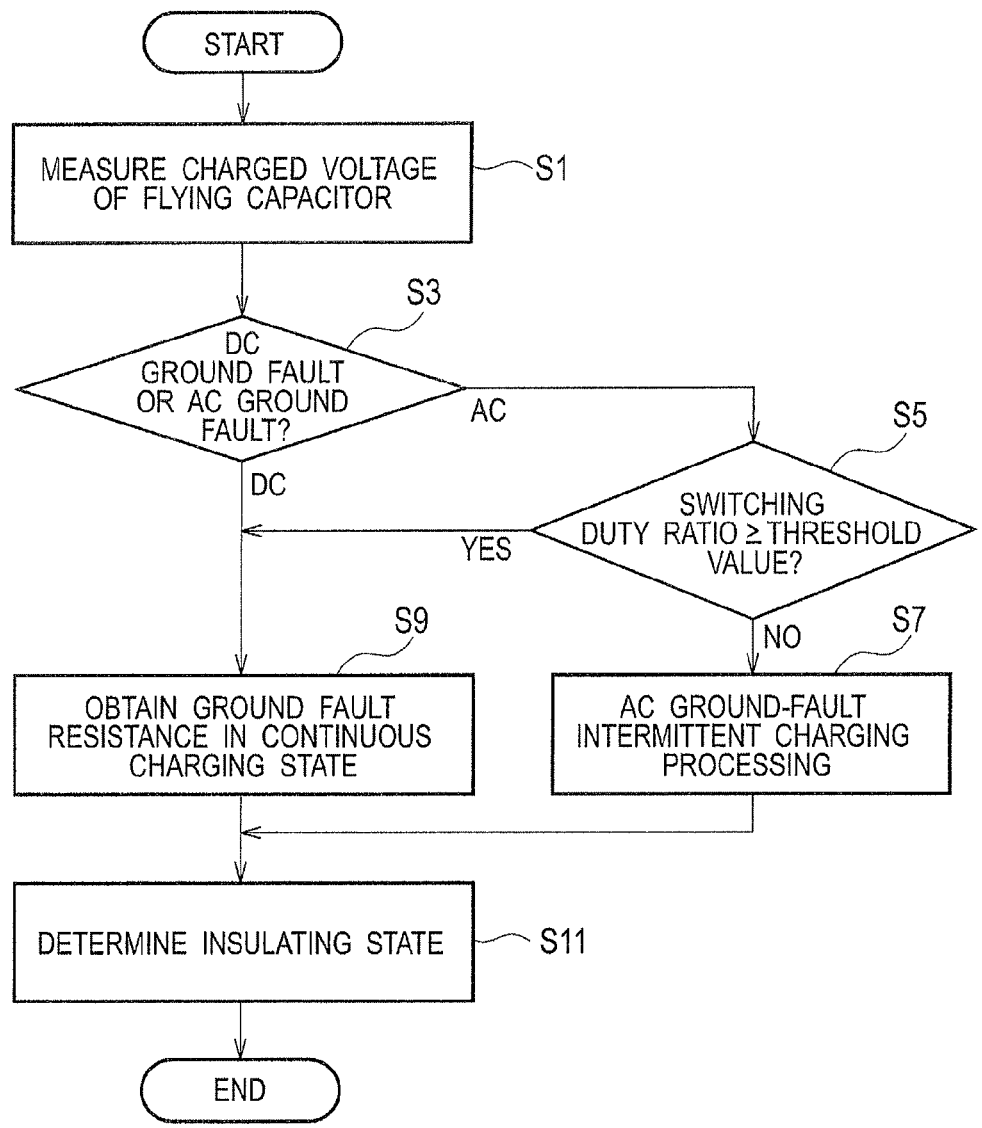
FIG. 9 is a flow chart showing a procedure in obtaining a ground fault resistance due to a DC ground fault or an AC ground fault in accordance with a program stored in a ROM which a microcomputer of a control unit of FIG. 2 incorporates.

As shown in FIG. 9, first, the microcomputer 15 measures a charge voltage of the flying capacitor C1 (Step S1). In the measurement of this Step S1, the microcomputer 15 measures three types of charge voltages of the flying capacitor C1. The first type of charge voltage is a charge voltage in having charged the flying capacitor C1 with a charge amount corresponding to the voltage of the DC power supply B. The second type of charge voltage is a charge voltage in having charged with a charge amount corresponding to the negative-side ground fault resistance RLn on the primary side or the ground fault resistance RL on the secondary side. The third type is a charge voltage in having charged with a charge amount corresponding to the positive-side ground fault resistance RLp on the primary side or the ground fault resistance RL on the secondary side. Any of the charge voltages is the charge voltage in having charged the flying capacitor C1 over a scheduled time period, after fully discharging the same.

Next, the microcomputer 15 determines which occurrence of a DC ground fault or an AC ground fault detected (Step S3). The determination of this Step S3 is made whether or not the charge voltage corresponding to the negative-side ground fault resistance RLn on the primary side or the ground fault resistance RL on the secondary side and the charge voltage corresponding to the positive-side ground fault resistance RLp or the ground fault resistance RL on the secondary side, both of which the microcomputer 15 measured in Step S1, coincide with each other (including the cases where the both charge voltages differ within a predetermined error range). Then, when the both do not coincide with each other, the microcomputer 15 determines that the occurrence of a DC ground fault is detected, while when the both coincide with each other, the microcomputer determines that the occurrence of an AC ground fault is detected.

When it is determined that the occurrence of a DC ground fault in Step S3 is detected, the microcomputer 15 moves the processing to Step S9 to be described later. In contrast, when it is determined that the occurrence of an AC ground fault in Step S3 is detected, the microcomputer 15 determines whether or not the switching duty ratio of respective semiconductor switches of the three-phase inverter circuit 3 is equal to or greater than a predetermined threshold value (Step S5).

Here, as the switching duty ratio, a value indicated by the latest data periodically received from the non-illustrated vehicle propulsion controller is used. Moreover, the predetermined threshold value may be set to 100/3(%) in which any of three semiconductor switches of the upper arm Q1 or the lower arm Q2 of the three-phase inverter circuit 3 is always ON.

That is, setting the predetermined threshold value to 100/3(%) means to determine, by using a predetermined threshold value, whether or not the flying capacitor C1 is in a continuous charging state during a scheduled time period in which the flying capacitor C1 is charged with a charge amount corresponding to the negative-side ground fault resistance RLn on the primary side or the ground fault resistance RL on the secondary side or with a charge amount corresponding to the positive-side ground fault resistance RLp on the primary side or the ground fault resistance RL on the secondary side.

However, even if the switching duty ratio is less than 100/3(%), the flying capacitor C1 may become in a substantially continuous charging state during a scheduled time period. That is, for example, the previously described case where the flying capacitor C1 reaches a continuous charging state by the Y condensers Y+ and Y– (see FIG. 8) discharging the charged electric charge during the scheduled time period. Accordingly, a value of the minimum switching duty ratio, with which a continuous charging state is secured in this manner, may be set to the predetermined threshold value. This predetermined threshold value may be stored in a nonvolatile RAM which the microcomputer 15 incorporates.

Then, when the switching duty ratio of respective semiconductor switches of the three-phase inverter circuit 3 is equal to or greater than the predetermined threshold value (YES in Step S5), the microcomputer 15 moves the processing to Step S9. In contrast, when the switching duty ratio is not equal to or greater than the predetermined threshold value (NO in Step S5), the microcomputer 15 executes an AC ground-fault intermittent charging processing (Step S7).

In the AC ground-fault intermittent charging processing of Step S7, the microcomputer 15 performs any of the following three types of processing. The first processing is the processing for obtaining the ground fault resistance RL due to an AC ground fault by using the switching duty ratio of respective semiconductor switches of the three-phase inverter circuit 3 and the three types of charge voltages of the flying capacitor C1 measured in Step S1.

In this processing, first, from the charge voltage (=V0) of the flying capacitor C1 in having charged with a charge amount corresponding to the voltage of the DC power supply B measured in Step S1, the voltage (=VB) of the DC power supply B is calculated using a conversion equation. As this conversion equation, the equation described in, for example, Japanese Patent No. 3962990 can be used. When this equation is applied to the present embodiment, a conversion equation below is obtained.

$$V0 = VB\{1 - e^{(-T/C*R1)}\} \quad \text{(Equation 1)}$$

Here, T is the scheduled time period, C is the static capacitance of the flying capacitor C1, and R1 is the resistance value of the resistor R1 of the ground fault detection unit 11.

Next, the ground fault resistance RL due to an AC ground fault is calculated using the conversion equation, from the charge voltage (=VCn) corresponding to the negative-side ground fault resistance RLn on the primary side or the ground fault resistance RL on the secondary side, the charge voltage (=VCp) corresponding to the positive-side ground fault resistance RLp on the primary side or the ground fault resistance RL on the secondary side measured in Step S1, the voltage VB of the DC power supply B, and the switching duty ratio of respective semiconductor switches of the three-phase inverter circuit 3.

Note that, the AC ground-fault intermittent charging processing of Step S7 is the processing that is performed when it is determined that, in Step S3, the occurrence of an AC ground fault is detected, and thus both the charge voltage corresponding to the negative-side ground fault resistance RLn on the primary side or the ground fault resistance RL on the secondary side and the charge voltage corresponding to the positive-side ground fault resistance RLp on the primary side or the ground fault resistance RL on the secondary side, measured in Step S1, are the charge voltages corresponding to the ground fault resistance RL on the secondary side. On the premise of this point, as the above-described conversion equation for obtaining the ground fault resistance RL due to an AC ground fault, the equation described in, for example, Japanese Patent No. 3224977 can be used.

This equation is based on an equation indicative of a relationship among the charge voltage(=VCn) corresponding to the negative-side ground fault resistance RLn on the primary side, the charge voltage(=VCp) corresponding to the positive-side ground fault resistance RLp on the primary side, and the voltage VB of the DC power supply B. When this relational equation is applied to the present embodiment, the relational equation is obtained as $$VCp = VCn = VB\{1 - e^{(-A*T/C*(R1+RL))}\}$$

Here, A is the switching duty ratio of respective semiconductor switches of the three-phase inverter circuit 3.

By arranging the above relational equation, the followings are obtained.

$$RL = -R1 - A*T/\{C*\ln(1 - VCp/VB)\} \quad \text{(Equation 2)}$$

$$= -R1 - A*T/\{C*\ln(1 - VCn/VB)\} \quad \text{(Equation 3)}$$

Accordingly, in the case of the present embodiment, the ground fault resistance RL due to an AC ground fault can be obtained, by substituting, as VCp of the above-described Equation 2, the charge voltage measured, in Step S1, as the charge voltage corresponding to the positive-side ground fault resistance RLp on the primary side or the charge voltage corresponding to the ground fault resistance RL on the secondary side, and furthermore by substituting, as VCn of the above-described Equation 3, the charge voltage measured, in Step S1, as the charge voltage corresponding to the negative-side ground fault resistance RLn on the primary side or the charge voltage corresponding to the ground fault resistance RL on the secondary side.

The above is the first processing which the microcomputer 15 can perform in the AC ground-fault intermittent charging processing of Step S7.

The second processing is the processing for obtaining the ground fault resistance RL due to an AC ground fault by using the three types of charge voltages of the flying capacitor C1 measured in Step S1. In the first processing described above, the ground fault resistance RL due to an AC ground fault is directly obtained from Equations 2 and 3 that takes into consideration the switching duty ratio A of each semiconductor switch of the three-phase inverter circuit 3. In contrast, in the second processing, with an equation that does not take into consideration the switching duty ratio A of each semiconductor switch of the three-phase inverter circuit 3, the ground fault resistance is obtained once, the obtained ground fault resistance is corrected in accordance with the switching duty ratio A of each semiconductor switch of the three-phase inverter circuit 3, and thus the ground fault resistance RL due to an AC ground fault is indirectly obtained.

In this processing, first, assuming a case where the flying capacitor C1 is in a continuous charging state during the scheduled time period during which the flying capacitor C1 is charged with the charge amount corresponding to the ground fault resistance RL due to an AC ground fault, a temporary ground fault resistance RL' in this case is obtained. Then, by correcting the obtained temporary ground fault resistance RL' through the use of the switching duty ratio A of each semiconductor switch of the three-phase inverter circuit 3, the true ground fault resistance RL due to an AC ground fault is obtained.

In this case, since it is assumed that the flying capacitor C1 was in a continuous charging state during a scheduled time period, the temporary ground fault resistance RL' can be obtained using the same conversion equation for the positive-side ground fault resistance RLp and the negative-side ground fault resistance RLn, due to a DC ground fault. As the conversion equation of the ground fault resistances RLp and RLn, the equation described in, for example, Japanese Patent No. 3962990 can be used.

This equation is an equation indicative of the relationship among the positive-side ground fault resistance RLp on the primary side, the charge voltage (=VCp) of the flying capacitor C1 corresponding to this ground fault resistance RLp, and the voltage VB of the DC power supply B, and an equation indicative of the relationship among the negative-side ground fault resistance RLn on the primary side, the charge voltage (=VCn) of the flying capacitor C1 corresponding to this ground fault resistance RLn, and the voltage VB of the DC power supply B. When these equations are applied to the present embodiment, each equation is obtained as follows:

$$RLp = -R1 - \{T/C^* \ln[1-(VCp/VB)]\} \quad \text{(Equation 4)}$$

$$RLn = -R1 - \{T/C^* \ln[1-(VCn/VB)]\} \quad \text{(Equation 5)}$$

Here, the voltage VB of the DC power supply B can be obtained from the above-described Equation 1. Accordingly, in the case of the present embodiment, the charge voltage measured in Step S1 as the charge voltage corresponding to the positive-side ground fault resistance RLp on the primary side or the charge voltage corresponding to the ground fault resistance RL on the secondary side is substituted as VCp of the above-described Equation 4, and furthermore the charge voltage measured in Step S1 as the charge voltage corresponding to the negative-side ground fault resistance RLn on the primary side or the charge voltage corresponding to the ground fault resistance RL on the secondary side is substituted as VCn of the above-described Equation 5, thereby obtaining the positive-side ground fault resistance RLp and the negative-side ground fault resistance RLn, due to a DC ground fault, equal to the temporary ground fault resistance RL'. Then, the obtained temporary ground fault resistance RL' is corrected with an appropriate correction equation corresponding to the switching duty ratio A of each semiconductor switch of the three-phase inverter circuit 3, thereby obtaining a true ground fault resistance RL due to a AC ground fault.

The above is the second processing which the microcomputer 15 can perform in the AC ground-fault intermittent charging processing of Step S7. In the second processing, until the temporary ground fault resistance RL' is obtained, the microcomputer 15 can continues the processing without taking into consideration the switching duty ratio A of each semiconductor switch of the three-phase inverter circuit 3. Therefore, even if the switching duty ratio A varies, the scale of performing the processing following this change is reduced as compared with the first processing, thereby enabling the microcomputer 15 to easily realize the processing which follows, in real time, a change in the switching duty ratio A and for accurately obtaining the ground fault resistance RL due to an AC ground fault.

The third processing is the processing in which the ground fault resistance RL due to an AC ground fault is not obtained. This processing can be employed, for example, when data indicative of the switching duty ratio A of each semiconductor switch of the three-phase inverter circuit 3 cannot be acquired from the non-illustrated vehicle propulsion controller.

After executing any of the above-described three types of processing as the AC ground-fault intermittent charging processing of Step S7, the microcomputer 15 moves the processing to the Step S11 to be described later.

Next, the processing in Step 9 will be described. This Step S9 is the processing that is performed when in Step S3 it is determined that the occurrence of a DC ground fault is detected, and when in Step S3 it is determined that the occurrence of an AC ground fault is detected and also in Step 5 it is determined that the switching duty ratio A of respective semiconductor switches of the three-phase inverter circuit 3 is equal to or greater than a predetermined threshold value.

That is, the processing in Step 9 is the processing for obtaining the positive-side ground fault resistance RLp and the negative-side ground fault resistance RLn, due to a DC ground fault, or the ground fault resistance RL due to an AC ground fault, when the flying capacitor C1 is in a continuous charging state during the scheduled time period in which the flying capacitor C1 is charged with a charge amount corresponding to the negative-side ground fault resistance RLn on the primary side or the ground fault resistance RL on the secondary side or a charge amount corresponding to the positive-side ground fault resistance RLp on the primary side or the ground fault resistance RL on the secondary side.

In this Step S9, the positive-side ground fault resistance RLp and the negative-side ground fault resistance RLn, due to a DC ground fault, can be obtained using the above-described Equations 4 and 5. That is, the charge voltage measured in Step S1 as the charge voltage corresponding to the positive-side ground fault resistance RLp on the primary side or the charge voltage corresponding to the ground fault resistance RL on the secondary side is substituted as VCp of the above-described Equation 4, and furthermore, the charge voltage measured in Step S1 as the charge voltage corresponding to the negative-side ground fault resistance RLn on the primary side or the charge voltage corresponding to the ground fault resistance RL on the secondary side is substituted as VCn of the above-described Equation 5, thereby obtaining the positive-side ground fault resistance RLp and the negative-side ground fault resistance RLn, due to a DC ground fault.

Furthermore, at the time of the occurrence of an AC ground fault, the flying capacitor C1 is also in a continuous charging state during the scheduled time period, so that the value obtained as the positive-side ground fault resistance RLp and the negative-side ground fault resistance RLn by using the above-described Equations 4 and 5 can be used as the value of the ground fault resistance RL due to an AC ground fault.

After executing the above-described processing of Step 9, the microcomputer 15 moves the processing to Step S11.

In Step S11, whether the insulating state of the step-up power supply circuit 1 is good or bad is determined by making a threshold value determination from the value of the ground fault resistance RLp, RLn, and RL obtained in Step 7 or Step 9. After executing the processing of Step 11, the microcomputer 15 terminates the series of processing.

As apparent also from the above description, in the present embodiment, the Step S3 in the flow chart of FIG. 9 is the processing corresponding to a first determination unit in the claims, and the Step S5 in FIG. 9 is the processing corresponding to a second determination unit in the claims. In addition, in the present embodiment, the second processing among three types of processing of Step S7 in FIG. 9 is the processing corresponding to a corrected-ground fault resistance calculation unit in the claims, and Step S9 in FIG. 9 is the processing corresponding to a ground fault resistance calculation unit in the claims.

In this manner, according to the ground fault detection unit 11 of the present embodiment, when an AC ground fault occurs on the secondary side of the three-phase inverter circuit 3 of the step-up power supply circuit 1, and when the flying capacitor C1 reaches a continuous charging state while forming a charge circuit including the ground fault resistance RL due to an AC ground fault, the ground fault resistance RL due to an AC ground fault is obtained using the same method as the method of the positive-side ground fault resistance RLp or the negative-side ground fault resistance RLn, due to a DC ground fault.

Therefore, even when the switching duty ratio A of each semiconductor switch of the three-phase inverter circuit 3 varies, at least the ground fault resistance RL of when the flying capacitor C1 reaches a continuous charging state while forming a charge circuit including the ground fault resistance RL due to an AC ground fault can be accurately obtained without using the data of the switching duty ratio A of each semiconductor switch of the three-phase inverter circuit 3. Accordingly, the detection of the insulating state of the secondary side of the three-phase inverter circuit 3, that is, the AC circuit portion of the step-up power supply circuit 1, based on an accurate value of the ground fault resistance RL due to an AC ground fault can be enabled.

Note that, in the above-described embodiment, in the Step S5 in the flow chart of FIG. 9, the microcomputer 15 determines whether or not the flying capacitor C1 is in a continuous charging state while forming a charge circuit including the ground fault resistance RL due to an AC ground fault, by using a predetermined threshold value related to the switching duty ratio A of each semiconductor switch of the three-phase inverter circuit 3.

However, in place of the predetermined threshold value related to the switching duty ratio A of each semiconductor switch of the three-phase inverter circuit 3, a predetermined threshold value related to other factor may be used.

Figure 10:
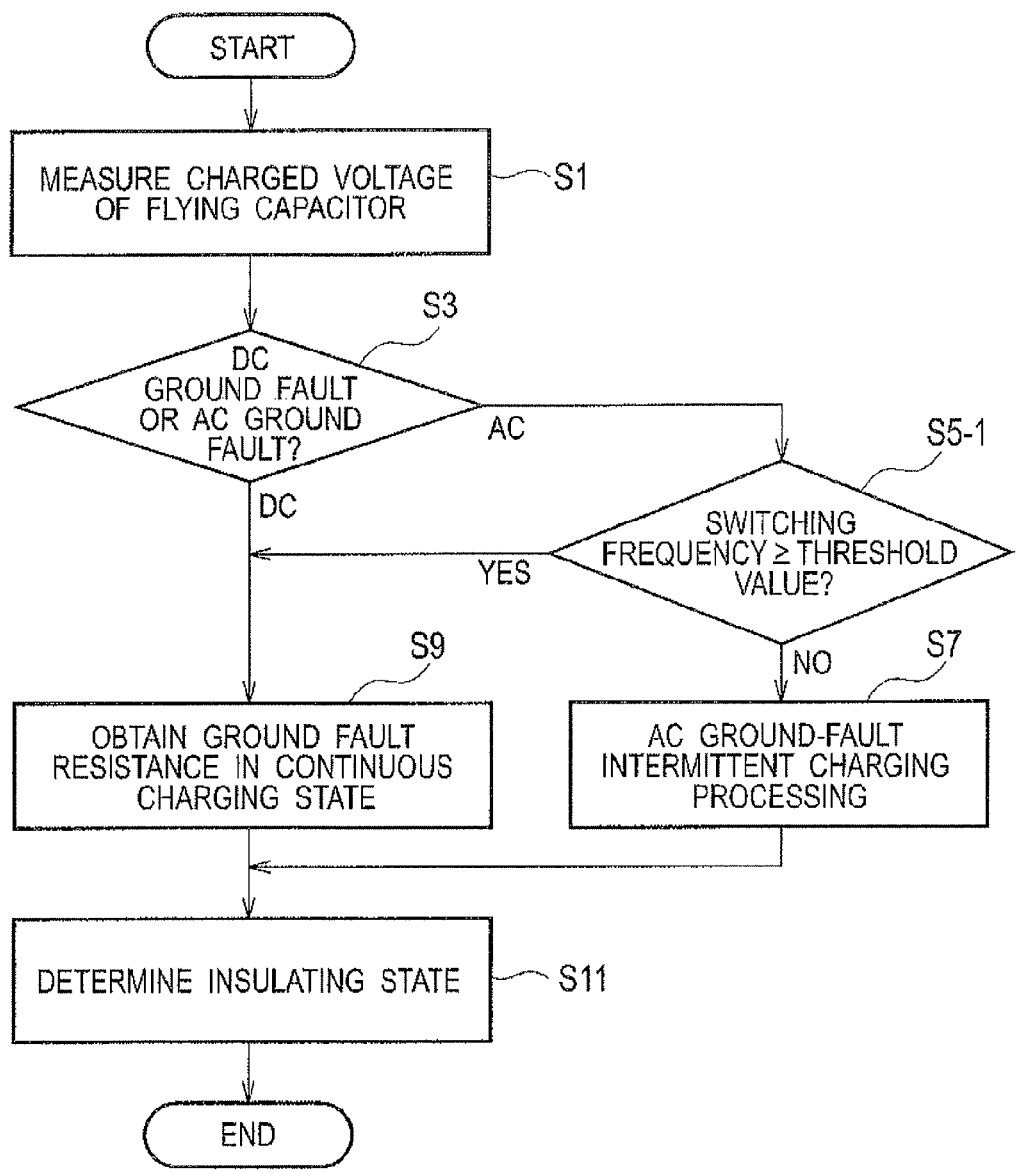
FIG. 10 is a flow chart showing another example of the procedure in obtaining a ground fault resistance due to a DC ground fault or an AC ground fault in accordance with a program stored in a ROM which a microcomputer of a control unit of FIG. 2 incorporates.

For example, as shown in a flowchart of FIG. 10, when in Step S3 it is determined that the occurrence of an AC ground fault is detected, the microcomputer 15 may determine whether or not the switching frequency of each semiconductor switch of the three-phase inverter circuit 3 is equal to or greater than a predetermined threshold value related to the switching frequency (Step S5-1).

That is, if the switching frequency of each semiconductor switch of the three-phase inverter circuit is high, an interval between the switch-off in the previous cycle of the semiconductor switch and the switch-on in the next cycle becomes shortened regardless of the magnitude of the switching duty ratio A. Then, the intermittent charging interval of the flying capacitor C1 while forming a charge circuit including the ground fault resistance RL due to an AC ground fault becomes shortened, and thus the flying capacitor C1 may reach a state close to the continuous charging state.

On the contrary, if the switching frequency of each semiconductor switch of the three-phase inverter circuit 3 is low, an interval between the switch-off in the previous cycle of the semiconductor switch and the switch-on in the next cycle becomes lengthened regardless of the magnitude of the switching duty ratio A. Then, the intermittent charging interval of the flying capacitor C1 while forming a charge circuit including the ground fault resistance RL due to an AC ground fault becomes lengthened, and thus the flying capacitor C1 reaches a state far from the continuous charging state.

Then, if the switching frequency of each semiconductor switch of the three-phase inverter circuit 3 is equal to or greater than a predetermined threshold value related to a switching frequency set to an appropriate value (YES in Step S5-1), the microcomputer 15 determines that the flying capacitor C1 is in the continuous charging state, and moves the processing to Step S9. On the contrary, if the switching frequency of each semiconductor switch of the three-phase inverter circuit 3 is less than the predetermined threshold value (NO in Step S5-1), the microcomputer 15 determines that the flying capacitor C1 is in the intermittent charging state, and moves the processing to Step Step 7.

Figure 11:
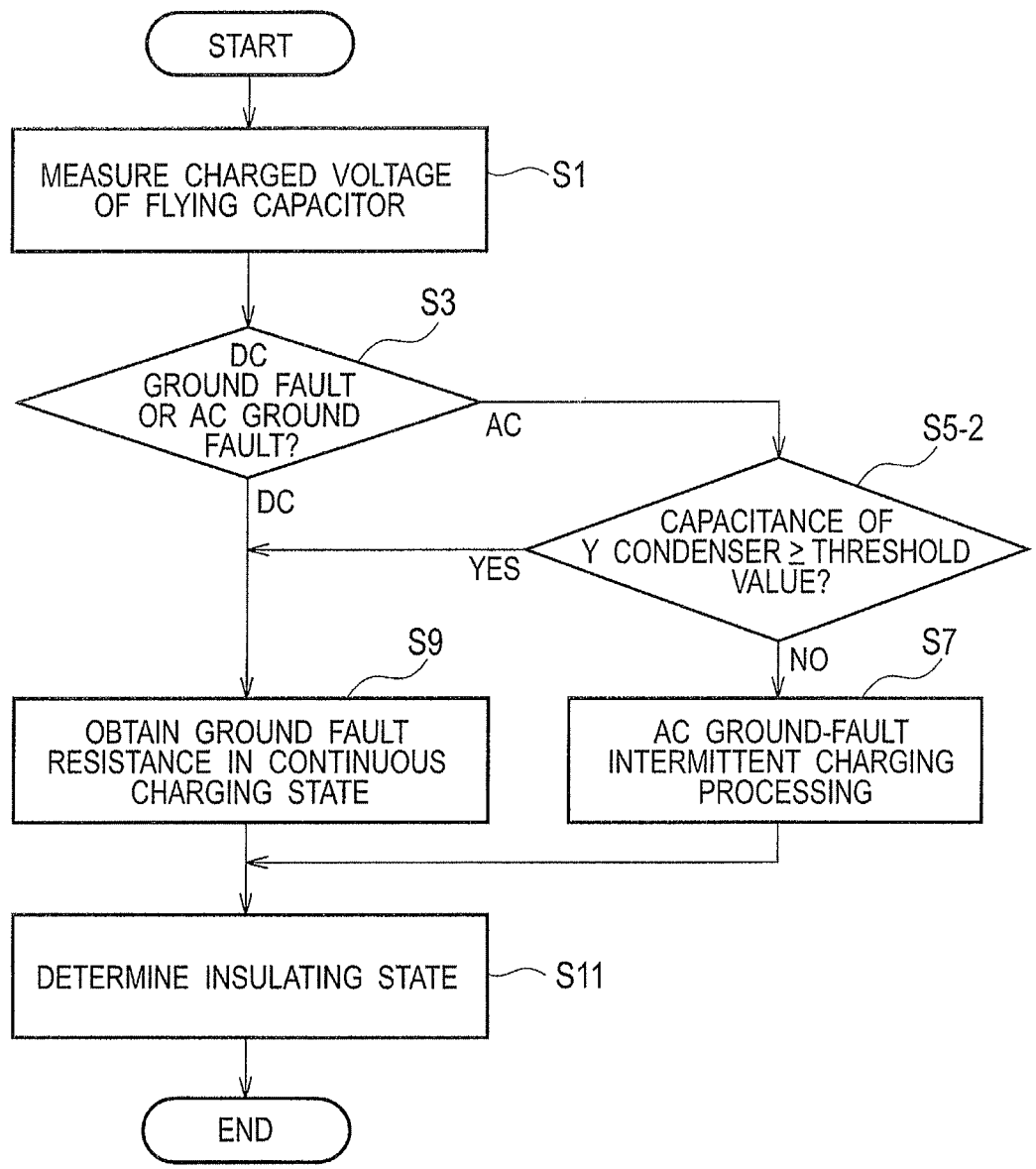
FIG. 11 is a flow chart showing another example of the procedure in obtaining a ground fault resistance due to a DC ground fault and an AC ground fault in accordance with a program stored in a ROM which a microcomputer of a control unit of FIG. 2 incorporates.

Furthermore, for example, as shown in a flow chart of FIG. 11, when in Step S3 it is determined that the occurrence of an AC ground fault is detected, the microcomputer 15 may determine whether or not the capacitance of the positive and negative Y condensers Y+ and Y− is equal to or greater than a predetermined threshold value related to the capacitance of the Y condenser (Step S5-2).

That is, when the capacitance of the Y condensers Y+ and Y− is high, then during a period during which the flying capacitor C1 is essentially not charged while forming a charge circuit including the ground fault resistance RL due to an AC ground fault, the flying capacitor C1 may be charged with the charge which the Y condensers Y+ and Y− discharge, and may reach a substantially continuous charging state.

Then, if the capacitance of the Y condensers Y+ and Y− is equal to or greater than a predetermined threshold value related to the capacitance of the Y condenser set to an appropriate value (YES in Step S5-2), the microcomputer 15 determines that the flying capacitor C1 is in the continuous charging state, and moves the processing to Step S9. On the contrary, if the capacitance of the Y condensers Y+ and Y− is less than the predetermined threshold value (NO in Step S5-2), the microcomputer 15 determines that the flying capacitor C1 is in the intermittent charging state, and moves the processing to Step Step 7.

Moreover, a configuration may be such that all of Step S5 in FIG. 9, Step S5-1 in FIG. 10, and Step S5-2 in FIG. 11 are performed and if, in any of the above Steps, the corresponding parameter becomes equal to or greater than the corresponding threshold value, the microcomputer 15 determines that the flying capacitor C1 is in the continuous charging state, and moves the processing to Step S9 of FIG. 9 (to FIG. 11). In this case, if the corresponding parameters become less than the corresponding threshold values in all of Step S5 in FIG. 9, Step S5-1 in FIG. 10, and Step S5-2 in FIG. 11, the microcomputer 15 determines that the flying capacitor C1 is in the intermittent charging state, and moves the processing to Step S7 of FIG. 9 (to FIG. 11).

In addition, for example, as shown in FIG. 7, the charging current of the flying capacitor C1 is measured using a current sensor 7, and from a temporal change in this measurement result, it may be determined whether or not the flying capacitor C1 is in the continuous charging state while forming a charge circuit including the ground fault resistance RL due to an AC ground fault.

Figure 12:
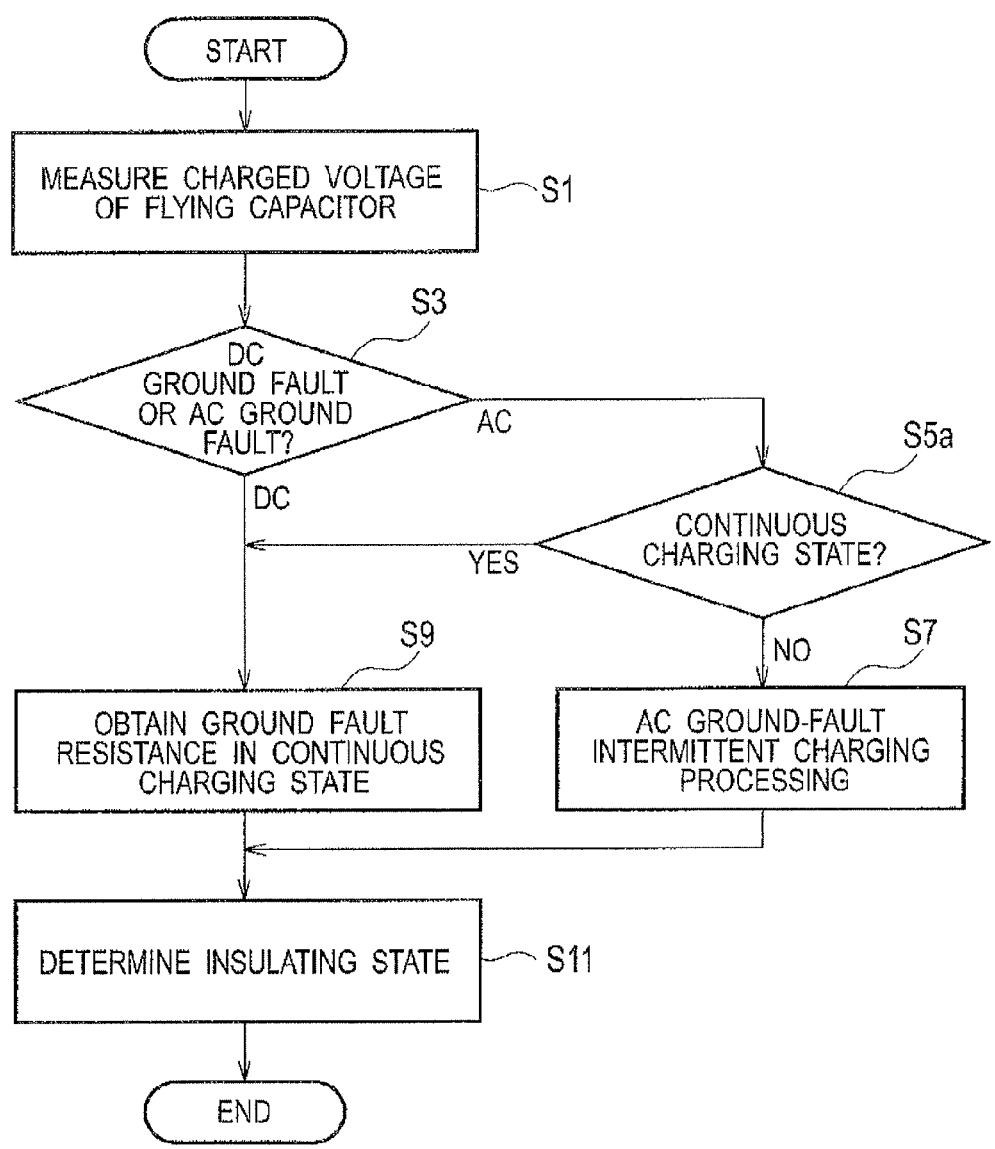
FIG. 12 is a flow chart showing another example of the procedure in obtaining a ground fault resistance due to a DC ground fault and an AC ground fault in accordance with a program stored in a ROM which a microcomputer of a control unit of FIG. 2 incorporates.

In this case, as shown in a flow chart of FIG. 12, in place of the processing of Step 5 in the flow chart of FIG. 9, in Step S5a the microcomputer 15 directly determines, from a temporal change in the measurement result of the current sensor 7, whether or not the flying capacitor C1 is in the continuous charging state while forming a charge circuit including the ground fault resistance RL due to an AC ground fault. Then, when the flying capacitor C1 is in the continuous charging state (YES in Step S5a), the microcomputer 15 moves the processing to Step S9, while when the flying capacitor C1 is not in the continuous charging state (NO in Step S5a), the microcomputer 15 moves the processing to Step S7. Even with such a configuration, the same effect as that of the above-described embodiment can be obtained.

Moreover, in the embodiment described above, in Step S3 in the flow charts of FIG. 9 to FIG. 12, depending on whether or not a charge voltage corresponding to the negative-side ground fault resistance RLn on the primary side or the ground fault resistance RL on the secondary side and a charge voltage corresponding to the positive-side ground fault resistance RLp on the primary side or the ground fault resistance RL on the secondary side, measured in Step S1, coincide with each other, the microcomputer 15 determines which occurrence of a DC ground fault or an AC ground fault is detected.

However, as long as there are used the charge voltage corresponding to the negative-side ground fault resistance RLn on the primary side or the ground fault resistance RL on the secondary side and the charge voltage corresponding to the positive-side ground fault resistance RLp on the primary side or the ground fault resistance RL on the secondary side measured in Step S1, the microcomputer 15 may perform determination with methods other than the method for determining whether or not the both charge voltages coincide with each other.

INDUSTRIAL APPLICABILITY

The present invention is suitably used in detecting an insulating state of a floating power supply which DC-AC converts an electric power of a DC power supply insulated from a ground potential portion using a three-phase inverter circuit provided on a main circuit wiring on a positive terminal side and a negative terminal side of this DC power supply and which supplies the resulting power to a three-phase motor, by using a value of a ground fault resistance of the main circuit wiring obtained based on a charge voltage of a condenser that has been connected, between the main circuit wiring and a ground potential portion, for a scheduled time period.

| Reference Signs List | |
|---|---|
| 1 | step-up power supply circuit (floating power supply) |
| 1n | negative-side main circuit wiring |
| 1p | positive-side main circuit wiring |
| 3 | three-phase inverter circuit |
| 5 | three-phase motor |
| 7 | current sensor |
| 11 | ground fault detection unit (device for detecting an insulating state of floating power supply) |
| 15 | microcomputer (first to fourth switching units, measurement unit, first determination unit, second determination unit, and corrected-ground fault resistance calculation unit) |
| A/D1 | A/D conversion port |
| B | DC power supply |
| C1 | flying capacitor (condenser) |
| D0 | diode |
| D1 | diode |

| Reference Signs List | |
|---|---|
| Q1 | upper arm |
| Q2 | lower arm |
| R1 | resistor |
| R3 | resistor |
| R4 | resistor |
| R5 | resistor |
| R6 | resistor |
| R6, R3, and R4 | resistor |
| RL | ground fault resistance |
| RLn | ground fault resistance |
| RLp | ground fault resistance |
| S1 | switch (first to fourth switching units) |
| S2 | switch (first to fourth switching units) |
| S3 | switch (first to fourth switching units) |
| S4 | switch (first to fourth switching units) |
| S5 | switch (first to fourth switching units) |
| VB | voltage |
| Y+ | positive-side Y condenser |
| Y− | negative-side Y condenser |

The invention claimed is:

1. A method for detecting an insulating state of a floating power supply, which DC-AC converts an electric power of a DC power supply insulated from a ground potential portion using a three-phase inverter circuit provided on a main circuit wiring on a positive terminal side and a negative terminal side of the DC power supply to supply the resulting power to a three-phase motor, by using a value of a ground fault resistance of the main circuit wiring obtained based on a charge voltage of a condenser that has been connected between the main circuit wiring and a ground potential portion for a scheduled time period, the method comprising the steps of:
    based on a charge voltage of the condenser, which initially has a discharged state, having been connected between one side of the main circuit wiring and the ground potential portion for the scheduled time period, and based on a charge voltage of the condenser, which initially has a discharged state, having been connected between other side of the main circuit wiring and the ground potential portion for the scheduled time period, determining whether an insulating state in a DC circuit portion of the floating power supply including the primary side of the three-phase inverter circuit is detected or an insulating state in an AC circuit portion of the floating power supply including the secondary side of the three-phase inverter circuit is detected;
    when it is determined that the insulating state in the AC circuit portion is detected, determining whether or not the condenser has been continuously charged during the scheduled time period; and
    when it is determined that the condenser has been continuously charged during the scheduled time period, obtaining a value of the ground fault resistance by using the same method as that of the case where it is determined that the charged state in the DC circuit portion is detected.

2. The method for detecting an insulating state of a floating power supply according to claim 1, further comprising the step of: when it is determined that the condenser has not been continuously charged during the scheduled time period, obtaining a value of the ground fault resistance by a method for a correction in accordance with a switching duty ratio at the time of DC-AC conversion of the three-phase inverter circuit.

3. The method for detecting an insulating state of a floating power supply according to claim 1, further comprising the step of: when it is determined that the condenser has not been continuously charged during the scheduled time period, obtaining a value of the ground fault resistance by a method for a correction in accordance with a switching frequency at the time of the DC-AC conversion of the three-phase inverter circuit.

4. The method for detecting an insulating state of a floating power supply according to claim 1, further comprising the step of: when it is determined that the condenser has not been continuously charged during the scheduled time period, obtaining a value of the ground fault resistance by a method for a correction in accordance with a capacitance of positive and negative Y condensers connected between the ground potential portion and a positive terminal and a negative terminal of the DC power supply, respectively.

5. A device for detecting an insulating state of a floating power supply which DC-AC converts an electric power of a DC power supply insulated from a ground potential portion using a three-phase inverter circuit provided on a main circuit wiring on a positive terminal side and a negative terminal side of the DC power supply to supply the resulting power to a three-phase motor, by using a value of a ground fault resistance of the main circuit wiring obtained based on a charge voltage of a condenser that has been connected between the main circuit wiring and a ground potential portion, for a scheduled time period, the device comprising:
   a first switching unit configured to connect the condenser which has been discharged, between one side of the main circuit wiring and the ground potential portion, for the scheduled time period to charge the condenser;
   a second switching unit configured to connect the condenser, which has been discharged, between other side of the main circuit wiring and the ground potential portion, for the scheduled time period to charge the condenser;
   a measurement unit configured to measure a charge voltage of the condenser;
   a third switching unit configured to connect the condenser charged using the first switching unit to the measurement unit for a measurement of a charge voltage of the condenser by the measurement unit;
   a fourth switching unit configured to connect the condenser charged using the second switching unit to the measurement unit for a measurement of a charge voltage of the condenser by the measurement unit;
   a first determination unit configured to determine, based on the charge voltage of the condenser measured by the measurement unit with the third switching unit and the charge voltage of the condenser measured by the measurement unit with the fourth switching unit, whether an insulating state in a DC circuit portion of the floating power supply including the primary side of the three-phase inverter circuit is detected or an insulating state in an AC circuit portion of the floating power supply including the secondary side of the three-phase inverter circuit is detected;
   a second determination unit configured to determine, when the first determination unit determines that the insulating state in the AC circuit portion is detected, whether or not the condenser has been continuously charged during the scheduled time period; and
   a ground fault resistance calculation unit configured to obtain, when the second determination unit determines that the condenser has been continuously charged during the scheduled time period, a value of the ground fault resistance by using the same method as that of the case where the first determination unit determines that the charged state in the DC circuit portion is detected.

6. The device for detecting an insulating state of a floating power supply according to claim 5, further comprising a corrected-ground fault resistance calculation unit configured to obtain, when the second determination unit determines that the condenser has not been continuously charged during the scheduled time period, a value of the ground fault resistance by a method for a correction in accordance with a switching duty ratio at the time of DC-AC conversion of the three-phase inverter circuit.

7. The device for detecting an insulating state of a floating power supply according to claim 5, further comprising a corrected-ground fault resistance calculation unit configured to obtain, when the second determination unit determines that the condenser has not been continuously charged during the scheduled time period, the value of the ground fault resistance by a method for a correction in accordance with a switching frequency at the time of the DC-AC conversion of the three-phase inverter circuit.

8. The device for detecting an insulating state of a floating power supply according to claim 5, further comprising a corrected-ground fault resistance calculation unit configured to obtain, when the second determination unit determines that the condenser has not been continuously charged during the scheduled time period, a value of the ground fault resistance by a method for a correction in accordance with a capacitance of positive and negative Y condensers connected between the ground potential portion and a positive terminal and a negative terminal of the DC power supply, respectively.

* * * * *